(12) United States Patent
Chang et al.

(10) Patent No.: US 6,846,517 B2
(45) Date of Patent: Jan. 25, 2005

(54) COATING DEVICE AND METHOD

(75) Inventors: Chih-Neng Chang, Taipei (TW);
An-Hwa Yu, Hsin-Chuang (TW);
Ming-Hua Chen, Hsin-Chuang (TW)

(73) Assignee: Prodisc Technology Inc., Taipei (TW)

( * ) Notice: Subject to any disclaimer, the term of this patent is extended or adjusted under 35 U.S.C. 154(b) by 190 days.

(21) Appl. No.: 10/262,068

(22) Filed: Oct. 2, 2002

(65) Prior Publication Data

US 2003/0203108 A1 Oct. 30, 2003

(30) Foreign Application Priority Data

Apr. 30, 2002 (TW) .......................................... 91108992

(51) Int. Cl.⁷ ................................................ B05D 5/00
(52) U.S. Cl. .................. 427/282; 427/255.5; 204/192.1
(58) Field of Search .............................. 427/282, 255.5; 204/192.1

(56) References Cited

U.S. PATENT DOCUMENTS

| 4,434,434 A | * | 2/1984 | Bhattacharya et al. ....... 257/737 |
| 4,548,698 A | * | 10/1985 | Sellschopp ............. 204/298.11 |
| 6,168,832 B1 | * | 1/2001 | Boucher ................... 427/248.1 |
| 6,250,758 B1 | * | 6/2001 | Yoshihara et al. .......... 351/163 |

* cited by examiner

*Primary Examiner*—Bret Chen
(74) *Attorney, Agent, or Firm*—Birch, Stewart, Kolasch & Birch, LLP

(57) ABSTRACT

A method for coating a film with more than two thicknesses in different sections of the film. A substrate is set on a turntable that spins regularly. A mask is set close to the substrate and a film is coated on the substrate by a coating source. The shape of the mask depends on the thickness of the film. The coating source is set opposite the turntable and the mask is set between the coating source and the turntable.

8 Claims, 6 Drawing Sheets

COATING DEVICE AND METHOD

BACKGROUND OF THE INVENTION

1. Field of Invention

This invention relates to a coating device and method. More particularly, this invention relates to a coating device and method for coating a film with more than two kinds of thickness.

2. Related Art

A coating process has been used extensively in the metal processing, semiconductor, optoelectronics, and other related industries. Continual advances in the semiconductor and optoelectronics industries have resulted in the rapid development of new coating technology processes.

However, coating a film with more than two kinds of thickness on a substrate, in particular, with a specific gradual change slope, has been difficult to achieve.

Previously, a typical coating method for coating a film with more than two different thicknesses in different sections on a substrate is tilting the substrate during the coating process. FIG. 1 is a schematic simplified diagram of a typical coating device 4. With reference to FIG. 1, a target 42 for sputtering or vacuum evaporation is put on a base 41, and a substrate 43 is set above the base 41. In this case, the substrate 43 is set above the base 41 with a tilting angle. Herein, the thickness of the coating film 5 is in an inverse proportion as the $1.5^{th}$ to $2^{nd}$ order of the distance between the base 41 and the substrate 43. Therefore, the thickness of a portion of the substrate 43 is as thick as substrate 43 is close to the base 41.

Although the tilting angle creates a gradient thickness on the substrate, it can't define a gradient slope at a specific point on the substrate. When the substrate is tilted at an angle, the gradient slope is pre-determined, and prevents coating the coating film with the desired specific gradual change slope.

SUMMARY OF THE INVENTION

In view of the foregoing, an objective of the invention is to provide a coating device and a coating method, which can control the thickness of the coating film precisely, so as to enable the coating of a film with more than two different thicknesses in different sections.

In accordance with the above objective, the disclosed coating device, which can coat a film with more than two different thicknesses in different sections, includes a turntable, a mask, and a coating source. The turntable spins regularly. The shape of the mask is determined by the thickness of the film, and the mask is set close to the substrate. The coating source is set opposite to the turntable, and the mask is set between the coating source and the turntable.

The invention also provides a method for coating a film with more than two different thicknesses in different sections. The invention includes a step for setting the substrate on a turntable which spins regularly and a step for setting a mask close to the substrate, wherein the shape of the mask is determined by the specific thickness of the coating film, and a step for coating the film on the substrate by a coating source.

The disclosed device and method use a mask to control the thickness of the coating film, so that the film can be coated with more than two different thicknesses in different sections on the substrate, more particularly with a desired specific gradual change slope. In other words, the shape of mask is determined according to the difference in thickness.

BRIEF DESCRIPTION OF THE DRAWINGS

The invention will become more fully understood from the detailed description given in the herein below illustration only, and thus are not limitative of the invention, and wherein.

DETAILED DESCRIPTION OF THE INVENTION

It will be understood that the illustration is for the purpose of describing a preferred embodiment of the invention and is not intended to limit the invention thereto.

Figure 1:
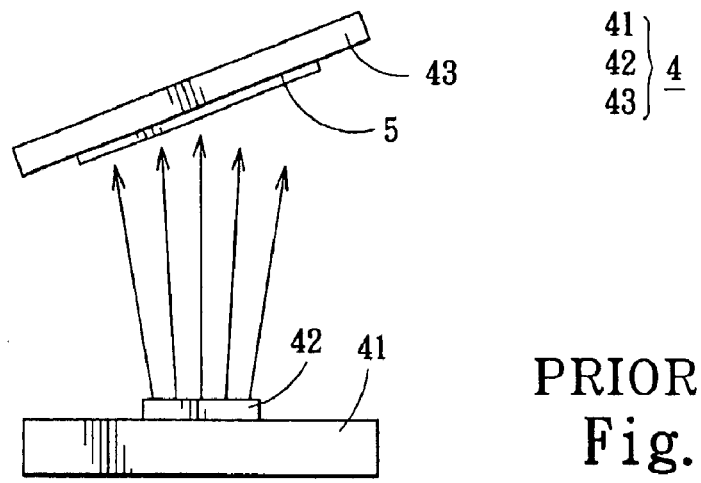
FIG. 1 is a diagram showing the structure of a conventional coating device.
Figure 2:
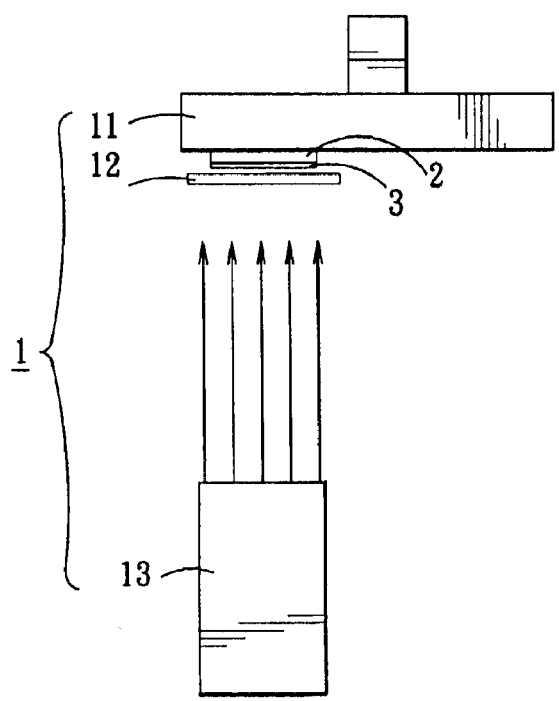
FIG. 2 is a diagram showing a preferred embodiment of a coating device according to the invention.

FIG. 2 shows a coating device, generally designated 1, for coating a coating film 3 with more than two different thicknesses in different sections. The coating device 1 includes a turntable 11, a mask 12, and a coating source 13. The turntable 11 spins regularly and a substrate 2 is set on the turntable 11. The shape of the mask 12 is determined by the thickness of the coating film 3 and the mask 12 is set close to the substrate 2. The coating source 13 is set opposite to the turntable 11, and the mask 12 is set between the coating source 13 and the turntable 11.

In this preferred embodiment, the turntable 11 spins at a constant angular velocity. That is, the time for spinning each circle is constant.

The shape of the mask 12 is determined depending on the thickness of the coating film 3. Herein, the shape of the mask 12 is composed of several concentric arcs, and the radian of these arcs control the specific thickness of the coating film 3. With reference to FIG. 3(A), FIG. 3(B), FIG. 3(C), FIG. 3(D), FIG. 3(E), FIG. 3(F), FIG. 3(G), and FIG. 3(H), the relation of the mask 12 and the specific thickness of the coating film 3 is expressed in terms of the following formula:

$$T_n = \left(1 - \frac{\theta_n}{360}\right) \times T \quad n \geq 2$$

In which: $T_n$ represents the thickness of the coating film 3, which is formed by the nth arc of the mask 12. T represents the thickness of the coating film 3, which is formed when turntable 11 spins a circle without the mask 12. $\theta_n$ represents the angle of the nth arc which is shadowed by the mask 12.

The method for designing the mask 12 for the specific gradient slope of the coating film 3 is illustrated below.

Figure 3A:
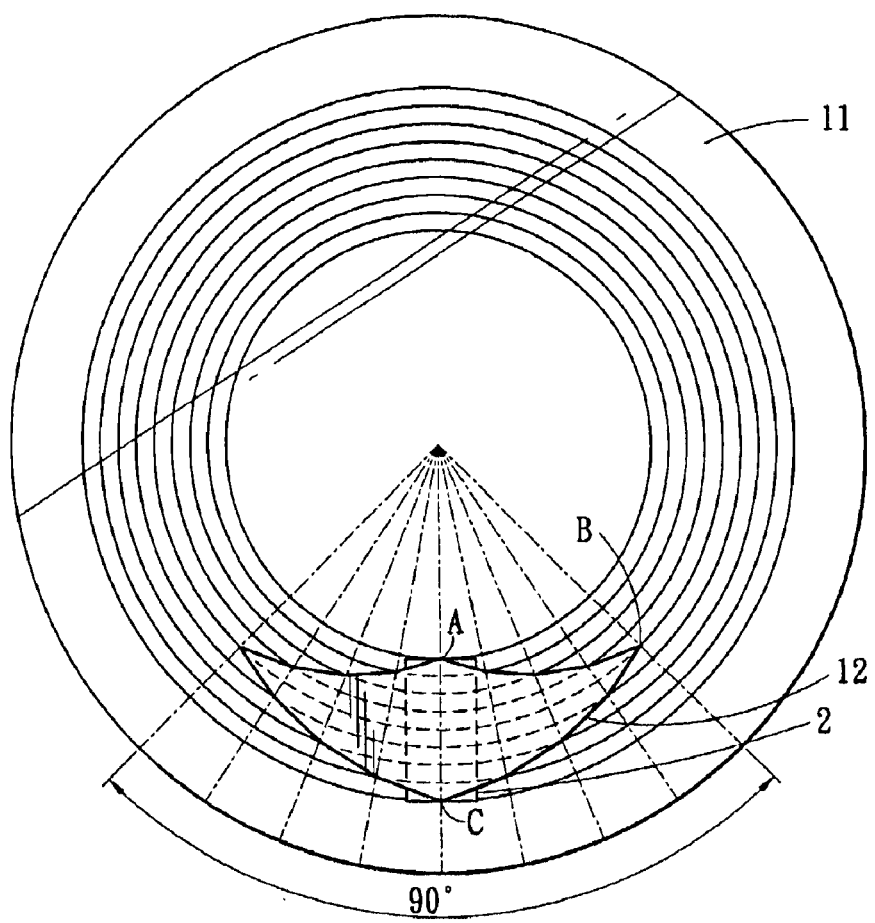
FIGS. 3(A), 3(B), 3(C), 3(D), 3(E), 3(F), 3(G), and 3(H) are diagrams showing a preferred embodiment of the mask and the film according to the invention.
Figure 3B:
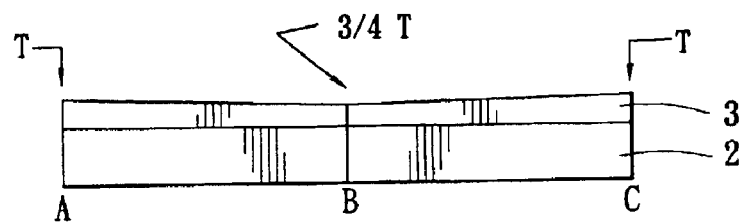

With reference to FIG. 3(A), the substrate 2 is set on the turntable 11 and the mask 12 is set near the substrate 2. The shape of the mask 12 is shown in FIG. 3(A). The mask 12 shadows three positions (A, B, and C) of the substrate 2 by 0, 90°/360° and 0, so the thickness of the coating film 3 on these three positions become T, ¾T and T. The thickness of T depends on the volume of the coating source 13. With reference to FIG. 3(B), the coating film 3 is a gradient film of which the two sides are thicker than the middle.

Figure 3C:
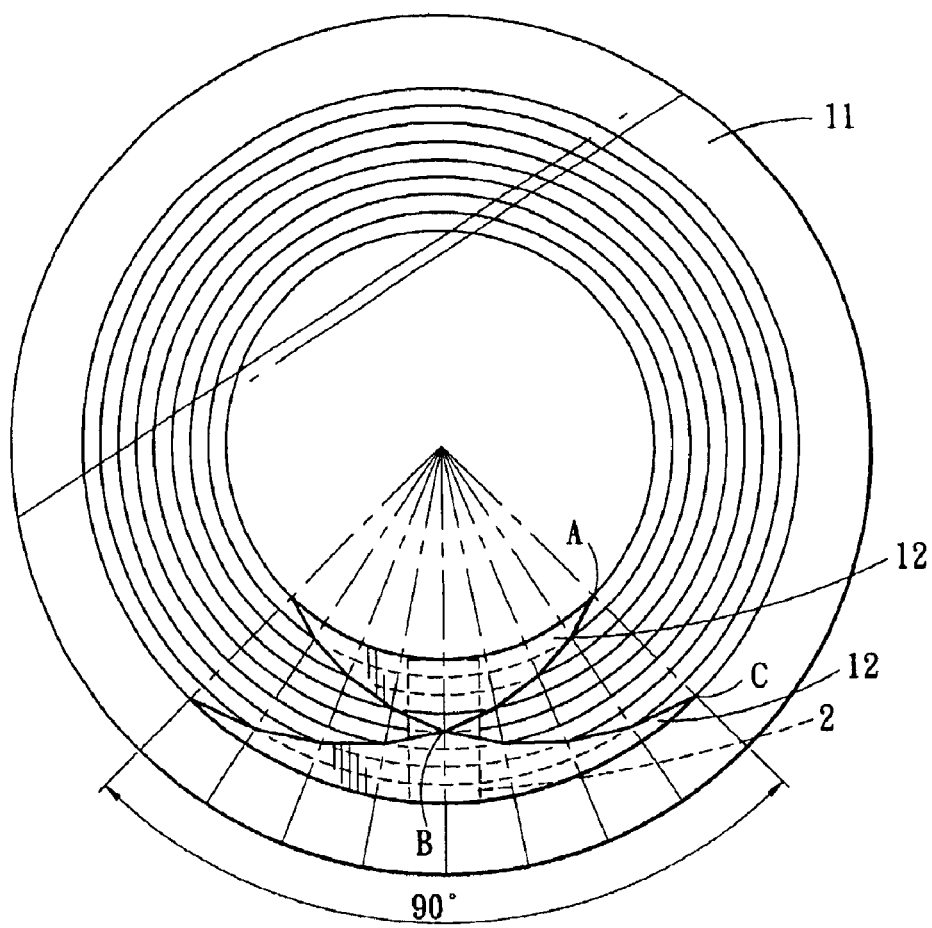
Figure 3D:
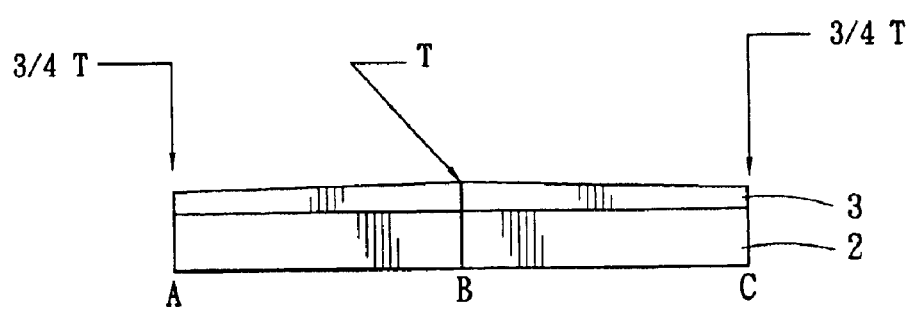

With reference to FIG. 3(C), the mask 12 shadows three positions (A, B, and C) of the substrate by 90°/360°, and 90°/360°, so the thickness of the coating film 3 on these three positions become ¾T, T and ¾T. With reference to FIG. 3(D), the coating film 3 is a gradient film of which the two sides are thinner than the middle.

Figure 3E:
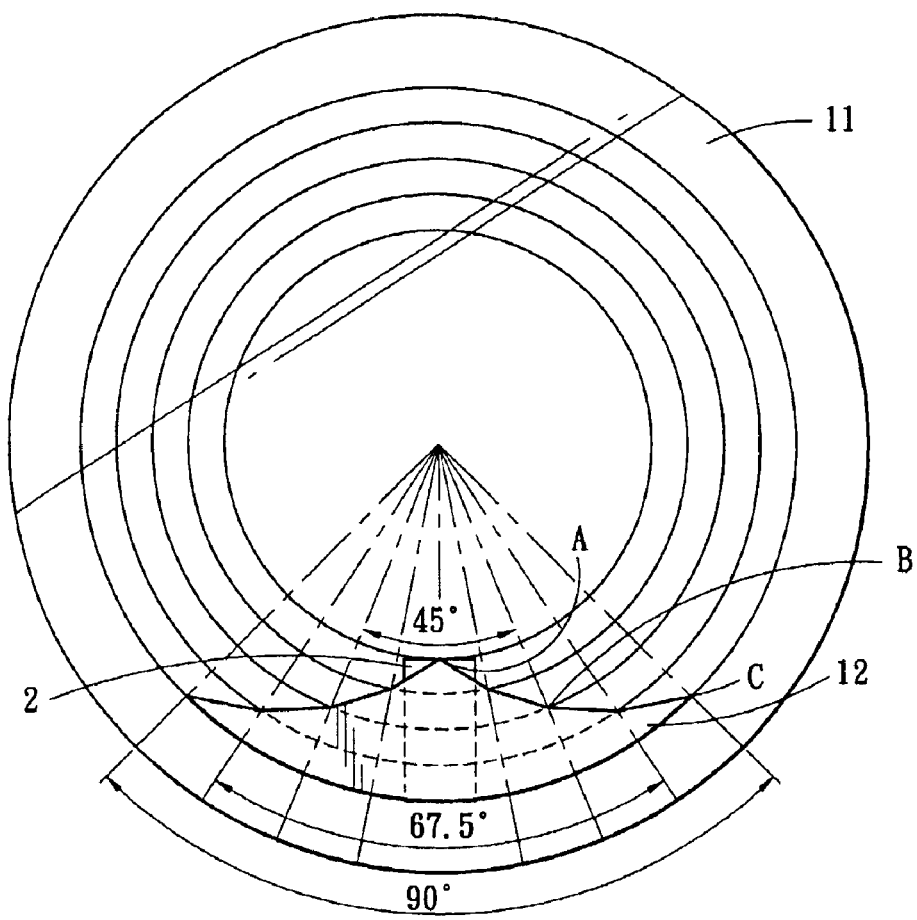
Figure 3F:
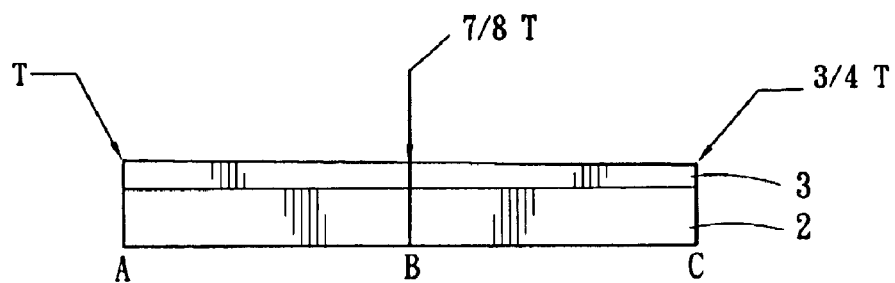

With reference to FIG. 3(E), the mask 12 shadows three positions (A, B, and C) of the substrate by 0, 45°/360° and 90°/360°, so the thickness of the coating film 3 on these three positions become T, ⅞T and ¾T. With reference to FIG. 3(F), the coating film 3 is a gradient film, which becomes thinner from point A to point C.

Figure 3G:
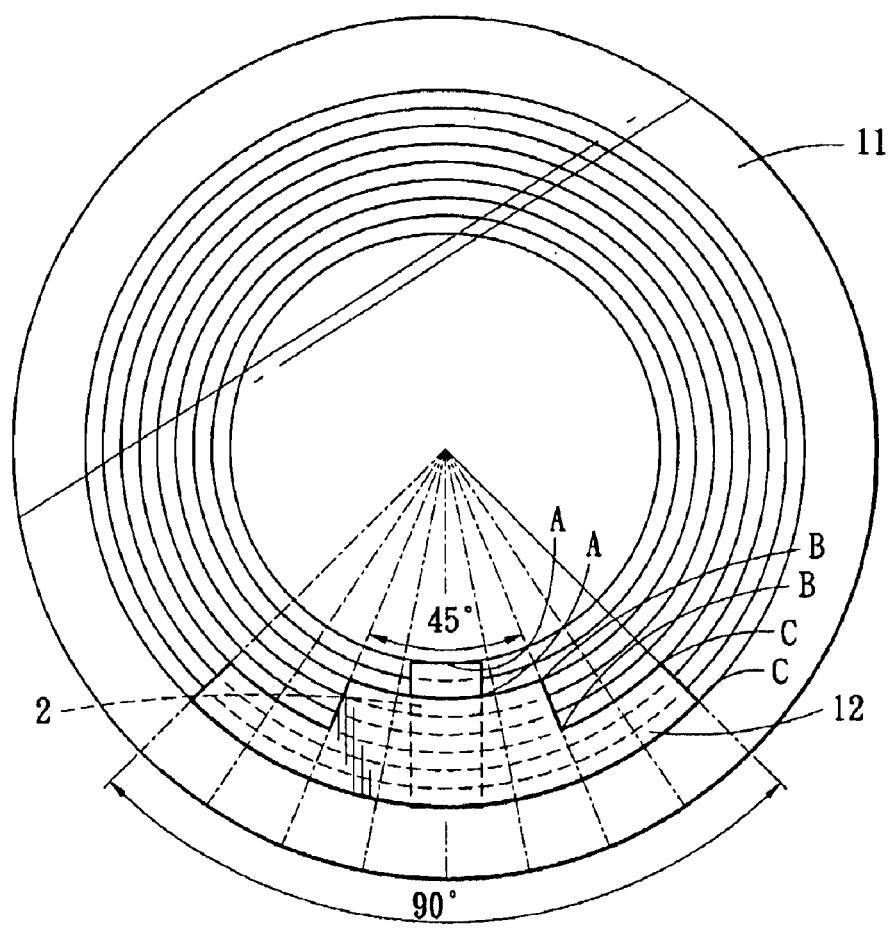
Figure 3H:
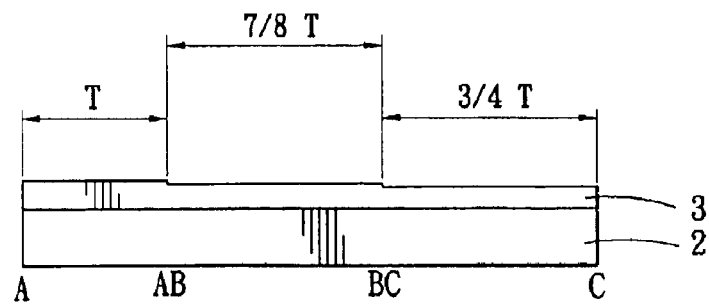

With reference to FIG. 3(G), the mask 12 shadows three sections (A—A, B—B, and C—C) of the substrate by 0, 45°/360° and 90°/360°, so the thickness of the coating film 3 on these three positions become T, ⅞T and ¾T. With reference to FIG. 3(H), the film 3 is a ladder-shaped film.

In which case, by using the mask 12, the form of the coating film 3 is not limited. By using the same principle, we can control the thickness on more or even infinite positions on the substrate accurately.

Herein, the coating source 13 is changed by different purpose. In vacuum evaporation, the coating source 13 may be put in a crucible, which is heated by an electron beam. In Sputtering, the coating source 13 may be a cathode target in DC plasma. Additionally, the coating source 13 may also be a feed, which is filled with the coating material.

Figure 4:
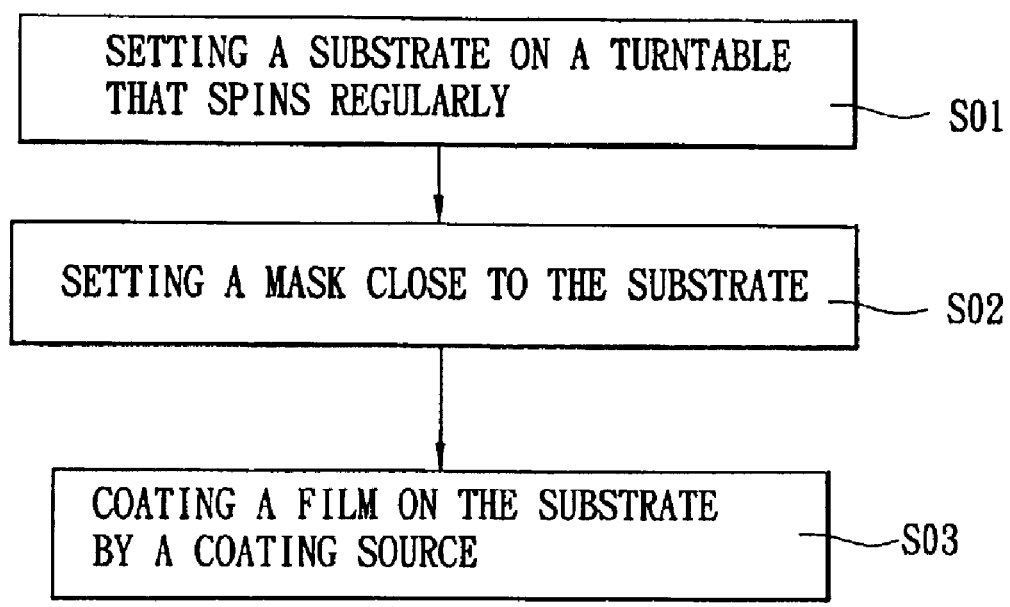
FIG. 4 is a flowchart of the method for coating according to the invention.

With reference to FIG. 4, a coating method for coating a film with more than two different thicknesses in different sections, according to a preferred embodiment of this invention, is disclosed. The method includes setting a substrate on a turntable that spins regularly (S01), setting a mask close to the substrate (S02), and coating a film on the substrate by a coating source (S03).

In this preferred embodiment, all elements and the character of the elements are the same as the first mentioned embodiment. In this preferred embodiment, the coating method is to use the coating device I in the first embodiment Certain variations, which are considered within the spirit and scope of the claimed invention, would be apparent to those skilled in the art.

What is claimed is:

1. A coating method for coating a film with more than two different thicknesses in different sections of the film, comprising the steps of:

wetting a substrate on a turntable, which spins regularly;

setting a mask close to the substrate, the shape of the mask being determined by the specific thickness of the film, and the relation between the mask and the film being expressed in terms of the following formula $$T_n = \left(1 - \frac{\theta_n}{360}\right) \times T \quad n \geq 2$$

wherein $T_n$ is the thickness of the film in a nth arc section of the mask,

T is the thickness of the film formed without the mask, $\theta_n$ is an angle of the nth arc of the mask, and coating the film on the substrate by a coating source.

2. The method of claim 1, wherein the turntable spins with a constant angular velocity.

3. The method of claim 1, wherein the shape of the mask comprises a plurality of concentric circle curves, the radian of the concentric circle curves control the specific thickness of the film.

4. The method of claim 1, wherein the coating source is an evaporation source.

5. The method of claim 1, wherein the coating source is a sputtering source.

6. The method of claim 1, wherein the coating source is a target.

7. The method of claim 1, wherein the mask sets between the coating source and the turntable.

8. A coating method for coating a film with more than two different thicknesses in different sections of the film, comprising the steps of:

setting a substrate on a turntable, which spins regularly;

forming a mask, the shape of the mask being determined by the specific thickness of the film, and the relation between the mask and the film being expressed in terms of the following formula $$T_n = \left(1 - \frac{\theta_n}{360}\right) \times T \quad n \geq 2$$

wherein $T_n$ is the thickness of the film in a nth arc section of the mask, T is the thickness of the film formed without the mask, $\theta_n$ is an angle of the nth arc of the mask;

setting the mask close to the substrate; and coating the film on the substrate by a coating source.

* * * * *